United States Patent [19]

Foell et al.

[11] Patent Number: 4,841,239

[45] Date of Patent: Jun. 20, 1989

[54] METHOD AND MEASURING INSTRUMENT FOR IDENTIFYING THE DIFFUSION LENGTH OF THE MINORITY CHARGE CARRIERS FOR NON-DESTRUCTIVE DETECTION OF FLAWS AND IMPURITIES IN SEMICONDUCTOR CRYSTAL BODIES

[75] Inventors: Helmut Foell; Volker Lehmann, both of Munich, Fed. Rep. of Germany

[73] Assignee: Siemens Aktiengesellschaft, Berlin and Munich, Fed. Rep. of Germany

[21] Appl. No.: 197,603

[22] Filed: May 20, 1988

[30] Foreign Application Priority Data

Jun. 15, 1987 [DE] Fed. Rep. of Germany ....... 3719921

[51] Int. Cl.$^4$ ............................................. G01R 31/26
[52] U.S. Cl. ............................. 324/158 R; 324/158 D
[58] Field of Search ............ 324/158 R, 158 D, 158 T; 136/290; 437/8

[56] References Cited

U.S. PATENT DOCUMENTS

| | | | |
|---|---|---|---|
| 4,051,437 | 9/1977 | Lile et al. .......................... | 324/158 R |
| 4,205,265 | 5/1980 | Staebler ........................... | 324/158 D |
| 4,544,887 | 10/1985 | Kamieniecki .................... | 324/158 R |
| 4,598,249 | 7/1986 | Goodman et al. ................ | 324/158 R |

FOREIGN PATENT DOCUMENTS 0120229 10/1984 European Pat. Off. .
3116611 3/1982 Fed. Rep. of Germany .

OTHER PUBLICATIONS

Kurtz et al; "Rapid Characterization . . . "; Conference Record, 19th IEEE Photovoltaic Specialists Conf., New Orleans, LA; May 4–8, 1987; Pub. Oct. 1987, pp. 823–826.

Library of Congress Cataloging Publication Data of "Texas Instruments Electronics Series", edited by Tyler G. Hicks and Lester Strong, 1975, pp. 104 through 129.

Primary Examiner—Ernest F. Karlsen

[57] ABSTRACT

Method and measuring instrument for identifying the diffusion length of minority charge carriers for non-destructive detection of flaws and impurities in semiconductor crystal bodies. The method provides that the semiconductor crystal body is positioned between two electrolyte-filled measuring chamber halves and that the minority charge carriers of the photocurrent that results at a front side of the semiconductor crystal body due to irradiation is detected by an applied constant voltage between a backside of the semiconductor crystal body and a rear electrolyte at the backside of the semiconductor crystal body. Taking the thickness (D) of the semiconductor crystal body into consideration, the diffusion length (L) can be calculated from a mathematical equation using the quotient of the minority charge carrier current $I_GI/o$ occurring at the backside and at the front side of the semiconductor crystal body. The method provides topically resolved measurements for irradiation of the semiconductor crystal body. A measuring instrument for the implementation of the method is disclosed. The method can be used for determining the quality of semiconductor crystals.

12 Claims, 2 Drawing Sheets

METHOD AND MEASURING INSTRUMENT FOR IDENTIFYING THE DIFFUSION LENGTH OF THE MINORITY CHARGE CARRIERS FOR NON-DESTRUCTIVE DETECTION OF FLAWS AND IMPURITIES IN SEMICONDUCTOR CRYSTAL BODIES

BACKGROUND OF THE INVENTION

The present invention relates to a method and to a measuring instrument for identifying the diffusion length of minority charge carriers and of their topical fluctuations for non-destructive detection of flaws and impurities in a semiconductor crystal body.

For qualitative characterization of the material of a semiconductor crystal, it is known to identify the diffusion length of the minority charge carriers therein since this is valid measurement of the number of recombination centers and traps in the semiconductor crystal. Two methods are standard for identifying the diffusion length of the minority charge carriers in a semiconductor crystal, measuring photoconductivity (photoconductive decay) and measuring the surface photovoltage. Both methods are disclosed in the text "Library of Congress Cataloging" in "Publication Data of Texas Instruments Elec. Ser.", edited by Tyler G. Hicks and Lester Strong, 1975, pages 105 through 129.

In measuring the photoconductivity, the semiconductor is irradiated with light such that electron hole pairs are generated and the change in conductivity is subsequently measured. The life time and, thus, the diffusion length of the minority charge carriers are capable of being identified therefrom. The shape of the semiconductor crystal is thereby of significance for the measurement and the semiconductor crystal must usually be destroyed before the measurement.

A surface photovoltage occurs when a semiconductor crystal is irradiated and can be measured by capacitative coupling. The surface photovoltage can be used to measure the diffusion length of the minority charge carriers. This method, however, has the disadvantage of a long measuring time since measurements with different light wavelengths must be successively carried out. Further, the topical resolution of the measurement is low since the irradiated area must have a size of at least 1 cm².

SUMMARY OF THE INVENTION

An object of the present invention is the measuring of the diffusion length of minority charge carriers in a semiconductor crystal body with optimum precision.

The invention is characterized by a method of the type initially cited wherein:

(a) the semiconductor crystal body is positioned between two electrolyte-filled measuring chamber halves such that a front side and a backside of the semiconductor crystal body are each in contact with the electrolyte of the measuring chamber;

(b) the semiconductor crystal body is connected to a voltage source via an ohmic contact and a voltage is applied between the backside of the semiconductor crystal body and an electrode of the measuring chamber half connected to the backside of the semiconductor crystal body, so that a blocking space charge zone arises at the backside of the semiconductor crystal body;

(c) the front side of the semiconductor crystal body is irradiated with light;

(d) the photocurrent $I_G$ of the minority charge carriers occurring at the backside of the semiconductor crystal body upon irradiation is measured;

(e) a voltage is applied between the front side of the semiconductor crystal body and an electrode of the measuring chamber half connected to the front side of the semiconductor crystal body, so that a blocking space charge zone is formed at the front side of the semiconductor crystal body;

(f) the photocurrent $I_0$ of the minority charge carriers occurring at the front side of the semiconductor crystal body upon irradiation is measured; and (g) the diffusion length L is calculated from the the mathematical equation:

$$I_G/I_0 = \frac{\alpha^2 \cdot L^2}{1 - \alpha^2 L^2} \cdot \frac{-2}{\exp(-D/L) + \exp(+D/L)}$$

Where $\alpha$ is the absorption coefficient and D is the specimen thickness.

The method is implemented with a measuring instrument that is characterized by:

(a) two measuring chamber halves held by a frame that can be individually filled with electrolyte and each of which contains an electrode;

(b) a holding mechanism for the semiconductor crystal body which is designed such that the semiconductor crystal body can be positioned between the measuring chamber halves, so that the front side and the backside of the semiconductor crystal body are each in contact with the content of a measuring chamber half;

(c) a terminal for producing an ohmic contact to the semiconductor crystal body;

(d) at least one light source such that a light ray is directed onto the surface of the semiconductor crystal body;

(e) a dc voltage source for applying a dc voltage between the semiconductor crystal body and the electrolyte; and (f) an ammeter means.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
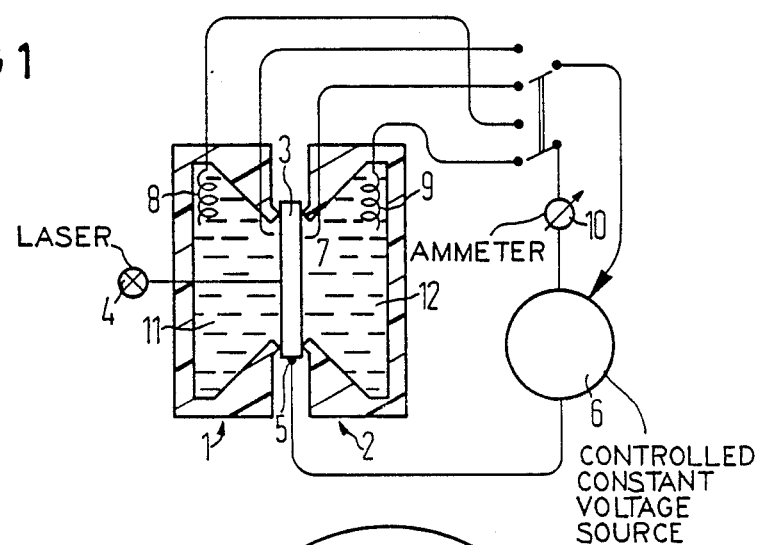
FIG. 1 is a schematic illustration of a measuring instrument for implementing the method of the present invention.

As shown in FIG. 1, a semiconductor crystal body 3 is situated between two electrolyte-filled measuring chamber halves 1 and 2. A connection between the semiconductor crystal body 3 and a controlled constant voltage source 6 (for example, a potentiostat) is produced via an ohmic contact 5. A constant voltage is produced between the ohmic contact 5 and the electrode 9 that is situated in the electrolyte 12 of the second measuring chamber half 2. The backside of the semiconductor crystal body 3 thus is in contact with the electrolyte 12 of the second measuring chamber half 2. A surface-proximate electrode 7 for measuring the voltage at the surface of the semiconductor crystal body 3 is located at the backside of the semiconductor crystal body 3, so that the constant voltage can be controlled with the measured voltage. The front side of the semiconductor crystal body 3 that is in contact with the electrolyte 11 of the first measuring chamber half 1 is irradiated with laser light from a laser 4. The light ray is deflectable by an apparatus (not shown) such that individual points on the surface of the semiconductor crystal body 3 can be designationally irradiated. For example, the deflection device for the light ray can be composed of an arrangement of mirrors.

During the measurement, the front side of the semiconductor crystal body 3 is scanned with the laser beam 4. The scan speed is typically 1 through 100 cm/sec for a spot size of 1 mm$^2$. The backside of the semiconductor crystal body 3 is located in the dark during the measurement and is positively biased relative to the electrolyte 12 before the measurement for an n-silicon semiconductor and is negatively biased relative to the electrolyte 12 for a p-silicon semiconductor. Constant voltages between 2 and 5 volts are typically selected. The silicon electrolyte contact then behaves like a diode polarized in a non-conducting direction, i.e., only a small leakage current flows. No voltage is applied between the front side of the semiconductor crystal body 3 and the electrolyte 11 of the first measuring chamber half 1. The electrolyte 11 serves the purpose of providing saturating surface conditions. The electrolyte 11, 12 is the same in both measuring chamber halves and, for example, can be composed of two percent hydrofluoric acid that has a few drops of a wetting agent added. Before the measurement it may be necessary to strip undesired surface layers on the semiconductor crystal body by electropolishing.

The minority charge carriers generated by irradiation of the front side of the semiconductor crystal body 3 diffuse through the semiconductor crystal body and recombine at potential recombination centers. The charge carriers that proceed up to the backside of the semiconductor crystal body 3 are acquired by the electrical field present there and are measured as photocurrent $I_G$ by the ammeter 10. It is advantageous to use a lock-in amplifier in the detection of the photocurrent $I_G$. The level of the photocurrent $I_G$ detected at the backside of the semiconductor crystal body 3 in relationship to the photocurrent $I_0$ generated at the front side of the semiconductor crystal body 3 is a measure of the density of the recombination centers of the semiconductor crystal body 3 and is thus linked to the minority charge carrier diffusion length L derived from the mathematical equation:

$$I_G/I_0 = \frac{\alpha^2 \cdot L^2}{1 - \alpha^2 L^2} \cdot \frac{-2}{\exp(-D/L) + \exp(+D/L)}$$

where D is the thickness of the semiconductor crystal body and $\alpha$ is the absorption coefficient. The portrayal of the photocurrent $I_G$ as a function of the coordinates of the laser beam incident on the front side produces an image of the distribution of the recombination centers in the volume of the semiconductor crystal body 3.

The photocurrent $I_0$ is measured while a constant voltage is applied between the front side of the semiconductor crystal body 3 and the electrolyte 11 of the first measuring chamber half 1 while the front side of the semiconductor crystal body is being irradiated. No voltage is applied to the back side of the semiconductor crystal body 3 during the measurement of $I_0$.

Figure 2:
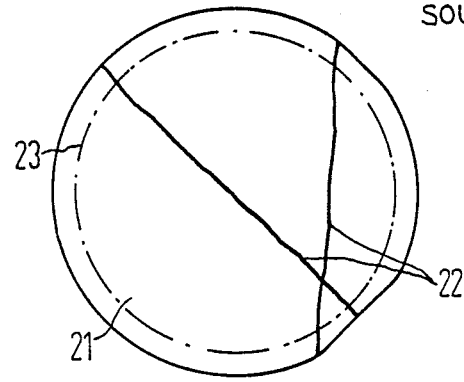
FIG. 2 schematically depicts a crystalline semiconductor wafer having impurities.

FIG. 2 depicts two lines of an iron impurity 22 situated on a crystalline semiconductor wafer 21. The line 23 marks the edge of the measuring area that is established by the geometrical dimensions of the measuring chamber halves 1 and 2.

Figure 3:
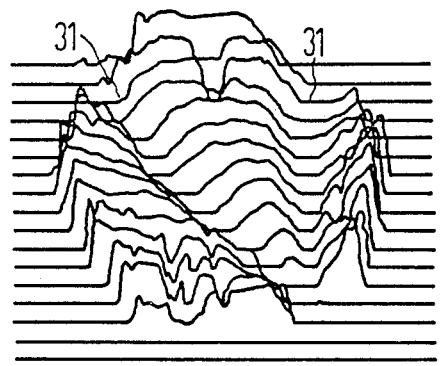
FIG. 3 shows the topical distribution of the impurities of the semiconductor wafer of FIG. 2.

FIG. 3 depicts a topically resolved measurement of the photocurrent $I_G$ which exhibits minimums 31 at those locations where the lines of iron impurity 22 are situated on the crystalline semiconductor wafer 21.

Figure 4:
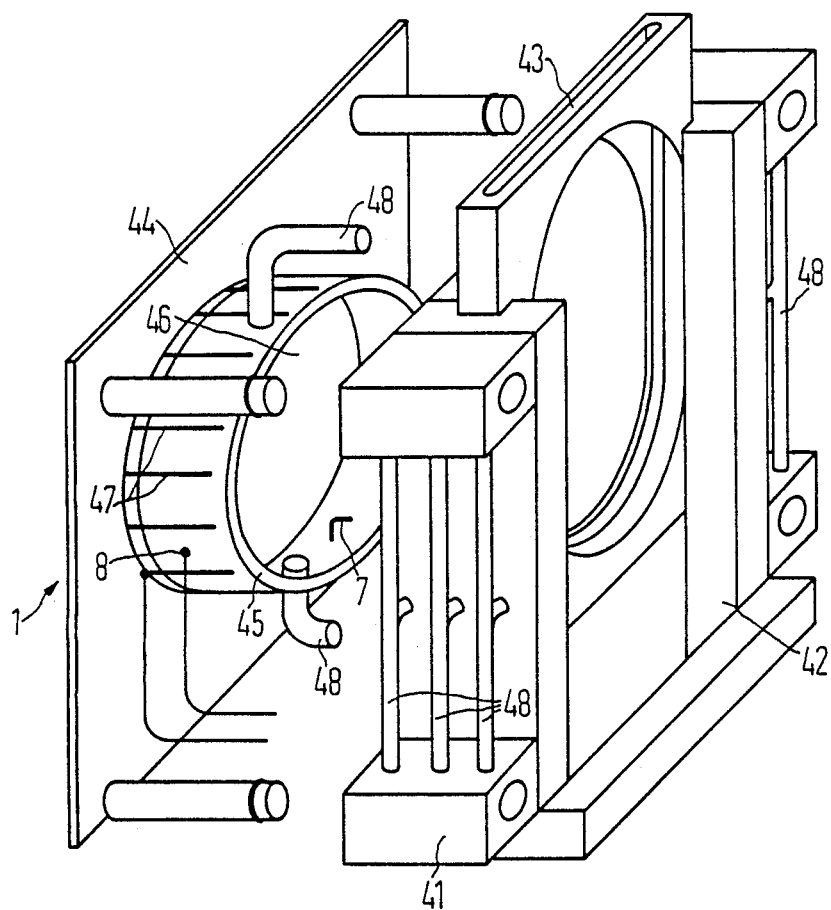
FIG. 4 is a perspective view of a measuring chamber half having a holding device for a semiconductor crystal body.

FIG. 4 depicts an embodiment of a measuring instrument having a central frame 41, having a holding mechanism having a holding frame 42 and an adaptor 43 for different semiconductor crystal bodies and having two measuring chamber halves of which only one (41) is shown in FIG. 4. The adaptor 43 can accept semiconductor crystal bodies having diameters from 10 mm through 200 mm and having thicknesses of a few 100 $\mu$m up to several millimeters. The carrier plate 44 of the measuring chamber half 1 is pressed against the central frame 41 by a pneumatic means (not shown in FIG. 4) such that sealing lips 45 of the measuring chamber half 1 adhere firmly to the semiconductor crystal body. The sealing lips 45 of the measuring chamber half 1 compensate for small irregularities of the semiconductor crystal body so that the crystal body need not be either round or entirely planar. Like the adaptor 43, the carrier plate 44 can be adapted to the respective semiconductor crystal body size.

The outer cover plate 46 of the measuring chamber half 1 is optically transparent and can be mounted on the carrier plate 44. The entire part of the measuring instrument containing electrolyte is resistant to acid, particularly hydrofluoric acid, and is preferably manufactured of polyvinyl chloride or Teflon. The transparent cover plate 46 can be fabricated of acrylic or silica glass that is either periodically changed or is coated with a thin protective layer. When the measuring chamber half 1 is pressed onto the semiconductor crystal body, an ohmic contact is produced by ring a 47 of measuring tips. The ring 47 of measuring tips can be provided with a plurality of measuring instruments, so that a check can be carried out therewith to determine if the electrical contact to the semiconductor crystal body is ohmic. The ring 47 of measuring tips can be optionally used instead of the ohmic contact shown in FIG. 5. Leads 48 provide for delivery of electrolyte, vacuum and compressed air.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for identifying the diffusion length (L) of minority charge carriers and their topical fluctuations and for non-destructive detection of flaws and impurities in a semiconductor crystal body, comprising the steps of:

(a) placing the semiconductor crystal body between two electrolyte-filled measuring chamber halves so that a front side and a backside of the semiconductor crystal body are each in contact with electrolyte contained in both measuring chamber halves;

(b) connecting the semiconductor crystal body to a voltage source via an ohmic contact and applying a voltage between the backside of the semiconductor crystal body and an electrode of the measuring chamber half connected to the backside of the semiconductor crystal body so that a blocking space charge zone is formed at the backside of the semiconductor crystal body;

(c) irridating with light the front side of the semiconductor crystal body;

(d) measuring the photocurrent $I_G$ of the minority charge carriers occurring at the backside during the irradiation, (e) applying a voltage between the front side of the semiconductor crystal body and an electrode of the measuring chamber half connected to the front side of the semiconductor crystal body so that a blocking space charge zone is formed at the front side of the semiconductor crystal body;

(f) measuring the photocurrent $I_0$ of substantially generated minority charge carriers occurring at the front side of the semiconductor crystal body upon irradiation;

(g) calculating the diffusion length (L) from the mathematical equation:

$$I_G/I_0 = \frac{\alpha^2 \cdot L^2}{1 - \alpha^2 L^2} \cdot \frac{-2}{\exp(-D/L) + \exp(+D/L)}$$

where $\alpha$ is the absorption coefficient and D is the specimen thickness.

2. The method according to claim 1, wherein the voltage between the backside of the semiconductor crystal body and the electrolyte residing in contact therewith is controlled between method steps (d) and (e).

3. The method according to claim 1, wherein the irradiation of the front side of the semiconductor crystal body with light occurs over the entire surface thereof, so that the average diffusion length (L) is calculated from the mathematical equation.

4. The method according to claim 1, wherein the semiconductor crystal body is scanned with a light ray so that a topically resolved measurement results therefrom.

5. The method according to claim 1, wherein the light is a laser light.

6. A measuring instrument for identifying the diffusion length of minority charge carriers and their topical fluctuations for non-destructive detection of flaws and impurities in a semiconductor crystal body comprising:

(a) two measuring chamber halves held by a central frame that can be individually filled with electrolyte and each of which contains an electrode;

(b) a holding mechanism in the central frame for the semiconductor crystal body such that the semiconductor crystal body can be positioned between the measuring chamber halves such that a front side and a backside of the semiconductor crystal body are each in contact with the electrolyte of the measuring chamber halves, respectively;

(c) a terminal for producing an ohmic contact to the semiconductor crystal body;

(d) at least one light source providing a light ray directed onto one surface of the semiconductor crystal body;

(e) a constant voltage source connected to the terminal and the electrolyte for applying a constant voltage between the semiconductor crystal body and the electrolyte; and (f) an ammeter means for measuring current flowing between the semiconductor crystal body and the electrolyte.

7. The measuring instrument according to claim 6, wherein the measuring instrument further comprises an electrical control circuit that keeps the voltage adjacent to the semiconductor crystal body constant.

8. The measuring instrument according to claim 6, wherein the measuring chamber halves are composed of material that is acid-resistant and at least resistant to hydrofluoric acid.

9. The measuring instrument according to claim 6, wherein the light source is a laser.

10. The measuring instrument according to claim 6, wherein the measuring instrument further comprises an apparatus with which the light beam can be deflected, so that the light ray can be moved across the surface of the semiconductor crystal body.

11. The measuring instrument according to claim 6, wherein the holding mechanism is composed of a holding frame for receiving an adaptor that can accept different semiconductor crystal bodies.

12. The measuring instrument according to claim 6, wherein a plurality of measuring tips on the two measuring chamber halves are provided for producing an ohmic contact to the semiconductor crystal body, these measuring tips being connected at a number of locations to both sides of the semiconductor crystal body.

* * * * *